US006815780B1

(12) United States Patent
Khemka et al.

(10) Patent No.: US 6,815,780 B1
(45) Date of Patent: Nov. 9, 2004

(54) SEMICONDUCTOR COMPONENT WITH SUBSTRATE INJECTION PROTECTION STRUCTURE

(75) Inventors: Vishnu Khemka, Phoenix, AZ (US); Vijay Parthasarathy, Phoenix, AZ (US); Ronghua Zhu, Chandler, AZ (US); Amitava Bose, Tempe, AZ (US); Todd C. Roggenbauer, Chandler, AZ (US)

(73) Assignee: Motorola, Inc., Schaumberg, IL (US)

( * ) Notice: Subject to any disclaimer, the term of this patent is extended or adjusted under 35 U.S.C. 154(b) by 0 days.

(21) Appl. No.: 10/417,972

(22) Filed: Apr. 15, 2003

(51) Int. Cl.[7] .......................... H01L 29/76; H01L 29/94; H01L 31/062; H01L 31/113; H01L 31/119

(52) U.S. Cl. ........................................ 257/374; 257/372

(58) Field of Search ............................... 257/374, 372, 257/394, 397

(56) References Cited

U.S. PATENT DOCUMENTS

| | | | | |
|---|---|---|---|---|
| 4,647,957 A | * | 3/1987 | Coquin et al. ............... | 257/374 |
| 5,021,860 A | | 6/1991 | Bertotti et al. ............... | 257/552 |
| 5,495,123 A | | 2/1996 | Canclini ....................... | 257/500 |
| 6,492,684 B2 | * | 12/2002 | Bolam et al. ................. | 257/349 |
| 6,600,199 B2 | * | 7/2003 | Johnson et al. .............. | 257/370 |
| 6,642,583 B2 | * | 11/2003 | Jimbo et al. .................. | 257/372 |
| 2002/0081809 A1 | | 6/2002 | Pinto et al. ................... | 438/296 |

OTHER PUBLICATIONS

Gonnard, et al., *Substrate Current Protection in Smart Power IC's*, 2000 Int'l Symp. On Power Semiconductor Devices, 169.

Raskin, et al., *Substrate Crosstalk Reduction Using SOI Technology*, 44 Institute of Electrical and Electronic Engineers Transactions on Electron Devices, 2252 (1997).

Casalta, et al., *Substrate Coupling Evaluation in BiCMOS Technology*, 32 Institute of Electrical and Electronics Engineers Journal of Solid–State Circuits, 598 (1997).

Huang, et al., *Schottky–Clamped NMOS Transistors Implemented in a Conventional 0.8–µm CMOS Process*, 19 Institute of Electrical and Electronics Engineers Electron Device Letters, 326 (1998).

Venkatesan, et al., *DC Substrate Coupling between LDMOS and CMOS Devices in Hyperintegration I Technology*, 1998 Institute of Electrical and Electronics Engineers BCTM 3.2, 57.

Laine, et al., *Active Pull–Down Protection For Full Substrate Current Isolation in Smart Power IC's*, 2002 Institute of Electrical and Electronics Engineers, 273.

Zhu, et al., *Suppression of Substrate Injection by Resurf LDMOS Devices in A Smart Power Technology for 20–30V Applications*, 1998 Institute of Electrical and Electronics Engineers BCTM 11.1, 184.

Gonnard, et al., *Multi–Ring Active Analogic Protection for Minority Carrier Injection Suppression in Smart Power Technology*, 2001 Proceedings of 2001 International Symposium on Power Semiconductor Devices & ICs, 351

* cited by examiner

Primary Examiner—Phat X. Cao
(74) Attorney, Agent, or Firm—Bryan Cave LLP (57) ABSTRACT

A semiconductor component includes a semiconductor substrate (210) having a first conductivity type, a semiconductor epitaxial layer (220) having the first conductivity type located over the semiconductor substrate, a first semiconductor device (110) and a second semiconductor device (130) located in the semiconductor epitaxial layer and including, respectively, a first semiconductor region (120) and a second semiconductor region (140), both having the second conductivity type, an ohmic contact region (150) in the semiconductor epitaxial layer having the first conductivity type and located between the first and second semiconductor devices, and at least one electrically insulating trench (160, 360) located in the semiconductor epitaxial layer and circumscribing at least the first semiconductor device. The semiconductor epitaxial layer has a doping concentration lower than a doping concentration of the semiconductor substrate.

22 Claims, 3 Drawing Sheets

SEMICONDUCTOR COMPONENT WITH SUBSTRATE INJECTION PROTECTION STRUCTURE

FIELD OF THE INVENTION

This invention relates generally to semiconductor components, and relates more particularly to electrical isolation of semiconductor devices.

BACKGROUND OF THE INVENTION

Automotive and other high power applications make use of various types of semiconductor components, including discrete devices and integrated circuits. As an example, the discrete devices can be power Metal-Oxide-Semiconductor (MOS) transistors having source, gate, and drain terminals. In order to reduce the cost and space required for the semiconductor components, MOS transistors and other semiconductor devices have been combined onto a single semiconductor chip. The combination of various semiconductor devices onto a single chip, however, can lead to the significant problem of minority carrier injection, which occurs when the drain terminal of the power MOS transistor is forward biased. More specifically, the forward biasing of the MOS drain terminal injects minority carriers into the semiconductor substrate, and the minority carriers can degrade the performance of the integrated circuit or circuits located on the same semiconductor chip.

Several attempts have been made to either contain the injected minority carriers or suppress the injection of minority carriers. These attempts, however, suffer from the disadvantages of significant silicon area consumption, low drain-to-source breakdown voltage, large epitaxial semiconductor layer thickness, and/or non-isolated power transistors. Accordingly, a need exists for a semiconductor component wherein a power transistor is combined with an integrated circuit on a single semiconductor chip, where the power transistor has a high drain-to-source breakdown voltage and is isolated from the integrated circuit, and where the significant silicon area consumption required by existing isolation techniques is avoided.

BRIEF DESCRIPTION OF THE DRAWINGS

The invention will be better understood from a reading of the following detailed description, taken in conjunction with the accompanying figures in the drawings in which.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner.

DETAILED DESCRIPTION OF THE DRAWINGS

In one embodiment of the invention, a semiconductor component comprises: a semiconductor substrate having a first conductivity type; a semiconductor epitaxial layer having the first conductivity type located over the semiconductor substrate; a first semiconductor device located in the semiconductor epitaxial layer and including a first semiconductor region having a second conductivity type; a second semiconductor device located in the semiconductor epitaxial layer and including a second semiconductor region having the second conductivity type; an ohmic contact region in the semiconductor epitaxial layer having the first conductivity type and located between the first semiconductor device and the second semiconductor device; and at least one electrically insulating trench located in the semiconductor epitaxial layer and circumscribing at least the first semiconductor device. The semiconductor epitaxial layer has a doping concentration lower than a doping concentration of the semiconductor substrate.

Figure 1:
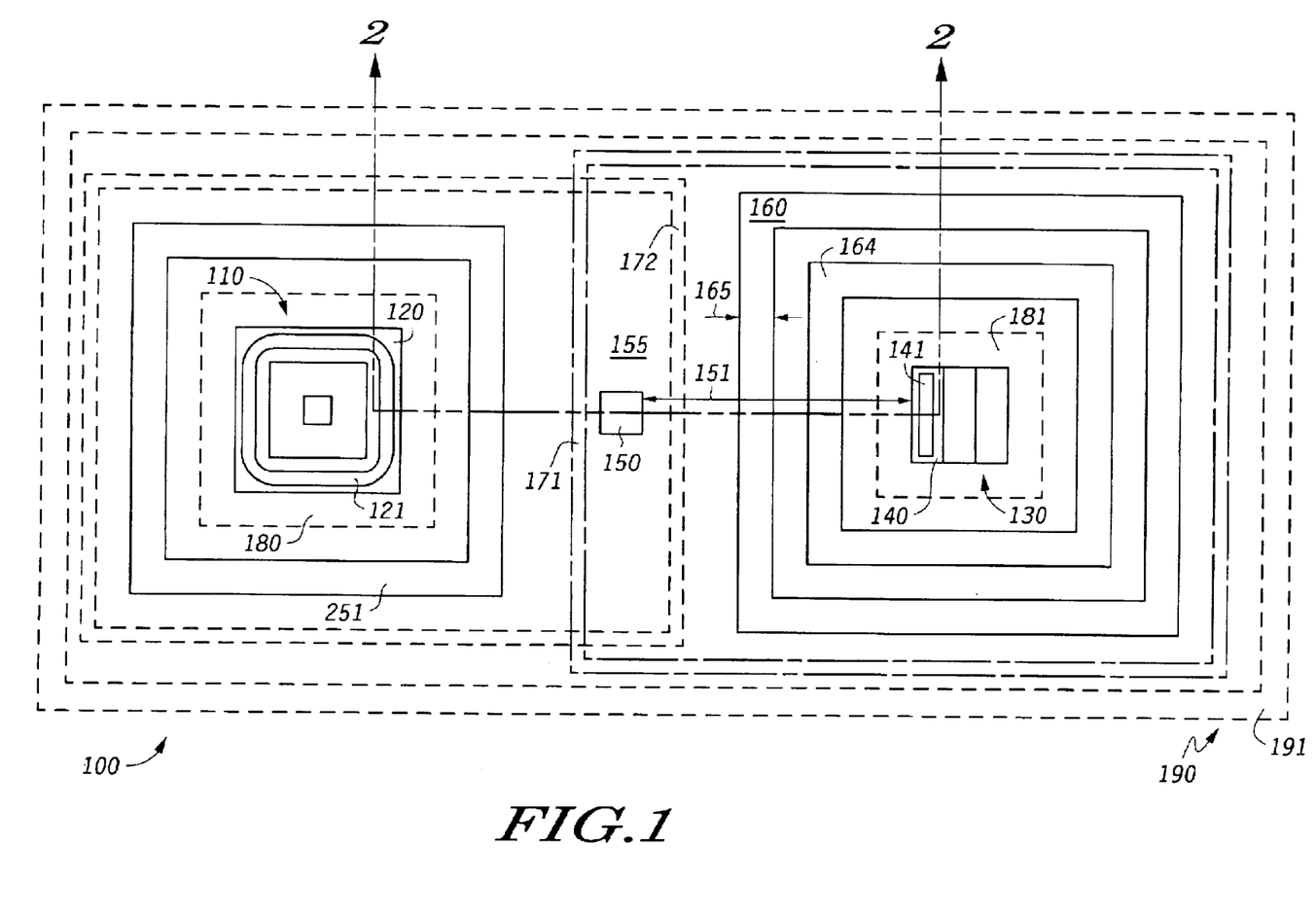
FIG. 1 is a top view of a portion of a semiconductor component according to an embodiment of the invention.
Figure 2:
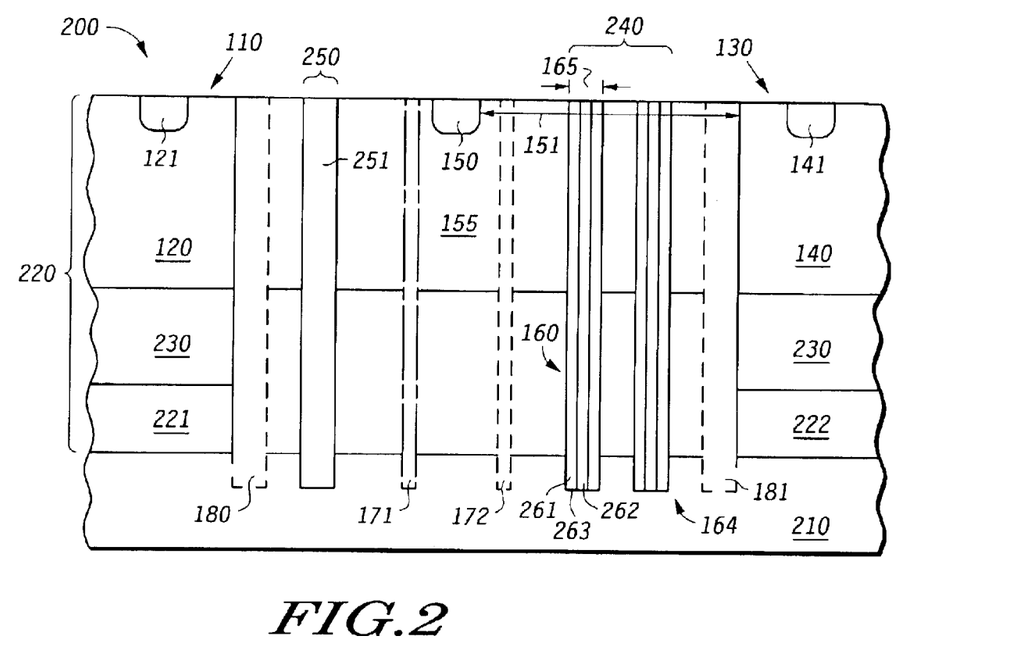
FIG. 2 is a cross-sectional view of a portion of the semiconductor component of FIG. 1 taken along a section line 2—2 in FIG. 1 according to an embodiment of the invention.

FIG. 1 is a top view of a portion of a semiconductor component 100 according to an embodiment of the invention. FIG. 2 is a cross-sectional view of a portion 200 of semiconductor component 100 of FIG. 1 taken along a section line 2—2 in FIG. 1 according to an embodiment of the invention. Referring now to FIGS. 1 and 2, portion 200 of semiconductor component 100 comprises: a semiconductor substrate 210 having a first conductivity type; a semiconductor epitaxial layer 220 having the first conductivity type located over semiconductor substrate 210; a semiconductor device 110 located in semiconductor epitaxial layer 220 and including a semiconductor region 120 having a second conductivity type; a semiconductor device 130 located in semiconductor epitaxial layer 220 and including a semiconductor region 140 having the second conductivity type; an ohmic contact region 150 in semiconductor epitaxial layer 220 having the first conductivity type and located between semiconductor device 110 and semiconductor device 130; and at least one electrically insulating trench 160 located in semiconductor epitaxial layer 220 between ohmic contact region 150 and semiconductor device 130 and circumscribing at least one of semiconductor device 110 and semiconductor device 130. Electrically insulating trench 160 has a width 165. Semiconductor region 120 includes an ohmic contact region 121 having the second conductivity type. Semiconductor region 140 includes an ohmic contact region 141 having the second conductivity type. In one embodiment, the first conductivity type is P-type and the second conductivity type is N-type. Accordingly, as an example, a particular embodiment of portion 200 of semiconductor component 100 may comprise: a P-type semiconductor substrate; a P-type semiconductor epitaxial layer; a first semiconductor device including an N-type semiconductor region; a second semiconductor device including an N-type semiconductor region; and a P-type ohmic contact region. Portion 200 of semiconductor component 100 further comprises a semiconductor region 155 in semiconductor epitaxial layer 220 and underneath and at least partially contiguous with ohmic contact region 150.

In a particular embodiment, semiconductor region 120 is an N-type semiconductor region that emits a plurality of N-type carriers, and semiconductor epitaxial layer 220 is a P-type semiconductor epitaxial layer. In this or another embodiment, electrically insulating trench 160 prevents at least a majority of the plurality of N-type carriers from entering P-type semiconductor epitaxial layer 220 under semiconductor device 130. In this context, the term "majority" means at least a substantial amount, defined as greater than approximately one order of magnitude, and preferably greater than approximately five orders of magnitude.

Semiconductor epitaxial layer 220 has a doping concentration lower than a doping concentration of semiconductor substrate 210. As an example, semiconductor epitaxial layer 220 can have a doping concentration of between approximately $5 \times 10^{14}$ atoms per centimeter cubed and $5 \times 10^{15}$ atoms per centimeter cubed, while semiconductor substrate 210 can have a doping concentration of between approximately $1 \times 10^{17}$ atoms per centimeter cubed and $1 \times 10^{19}$ atoms per centimeter cubed. In a particular embodiment, semiconductor epitaxial layer 220 has a doping concentration that is less than the doping concentration of semiconductor substrate 210 by at least two orders of magnitude.

As an example, semiconductor region 120 of semiconductor device 110 can be an emitter of minority carriers (referred to herein as an "emitter"). As a particular example, semiconductor device 110 can comprise an emitter in the form of an injecting terminal, which can be, for example, an N-type well or an N-type buried layer of a large-area power device. As another example, semiconductor region 140 of semiconductor device 130 can be a collector of minority carriers (referred to herein as a "collector"). As a particular example, semiconductor device 130 can comprise a collector in the form of a collecting terminal, which can be, for example, an N-type well or an N-type buried layer of a low voltage logic device. As another example, semiconductor device 110 can be a collector and semiconductor device 130 can be an emitter. As a further example, both semiconductor device 110 and semiconductor device 130 can be both collectors and emitters.

The number of electrically insulating trenches in portion 200 of semiconductor component 100 can be varied depending on a desired level of minority carrier suppression. As an example, portion 200 of semiconductor component 100 can comprise a greater number of electrically insulating trenches when semiconductor device 110 comprises a higher current device, which would emit a larger number of minority carriers, than when semiconductor device 110 comprises a lower current device, which would emit fewer minority carriers than the higher current device. As a particular example, consider a first semiconductor device and a second semiconductor device that are separated by a distance of approximately 110 micrometers. The placement of approximately 40–50 electrically insulating trenches between an emitter of the first semiconductor device and a collector of the second semiconductor device makes possible a minority carrier suppression of greater than nine orders of magnitude. In different embodiments, more or fewer electrically insulating trenches can be positioned between the emitter and the collector. As further discussed below, in one embodiment the electrically insulating trenches circumscribe only the emitter, while in other embodiments the electrically insulating trenches circumscribe: (a) only the collector; (b) both the emitter and the collector individually; or (c) the emitter and collector both individually and collectively.

In one embodiment, semiconductor region 120 is separated from semiconductor substrate 210 by a portion 221 of semiconductor epitaxial layer 220. In the same or another embodiment, semiconductor region 140 is separated from semiconductor substrate 210 by a portion 222 of semiconductor epitaxial layer 220. In the same or another embodiment, a layer 230 is located between semiconductor region 120 and portion 221. Layer 230 or a different layer may also be located between semiconductor region 140 and portion 222. As an example, layer 230 can be an N-type buried layer.

Electrically insulating trench 160 may extend into semiconductor substrate 210, as depicted in FIG. 2. In an alternative embodiment, electrically insulating trench 160 can terminate in semiconductor epitaxial layer 220, and not extend into semiconductor substrate 210 (see FIG. 3). In general, the ability of an electrically insulating trench to suppress minority carriers increases with increasing depth. Thus, an electrically insulating trench that extends into semiconductor substrate 210, as does electrically insulating trench 160 in FIG. 2, will generally be more effective at suppressing minority carriers than will an electrically insulating trench that terminates in semiconductor epitaxial layer 220.

In a particular embodiment, (see FIG. 2), electrically insulating trench 160 further comprises a portion 261 comprising an oxide, a portion 262 interior to portion 261 and comprising doped polysilicon, and a lower surface 263 in semiconductor substrate 210. Portion 262 extends to lower surface 263 and contacts semiconductor substrate 210. In this particular embodiment, the doped polysilicon in portion 262 is electrically biased during operation of portion 200 of semiconductor component 100. In the same or another embodiment, ohmic contact region 150 is electrically shorted to semiconductor substrate 210 during operation of portion 200 of semiconductor component 100. In a particular embodiment, both ohmic contact region 150 and semiconductor substrate 210 are grounded. In a non-illustrated, alternate embodiment, portion 262 does not extend to lower surface 263, and portion 261 is located between lower surface 263 and portion 262. In a different embodiment, electrically insulating trench 160 does not include portion 262, and instead is completely filled with the same oxide as is located in portion 261 or other electrically insulating material. In the same or another embodiment, width 165 of electrically insulating trench 160 is substantially equal to a distance 151 between ohmic contact region 150 and semiconductor device 130.

Portion 200 of semiconductor component 100 may further optionally comprise an electrically insulating trench 171 and/or an electrically insulating trench 172, as further explained below. In one embodiment of portion 200 of semiconductor component 100, ohmic contact region 150 circumscribes at least semiconductor region 120. In that embodiment, electrically insulating trench 172 circumscribes both ohmic contact region 150 and at least semiconductor region 120 of semiconductor device 110, thus providing electrical isolation for semiconductor device 110. In a different embodiment, ohmic contact region 150 circumscribes at least semiconductor region 140. In this different embodiment, electrically insulating trench 171 circumscribes both ohmic contact region 150 and at least semiconductor region 140 of semiconductor device 130, thus providing electrical isolation for semiconductor device 130. Either electrically insulating trench 171 or electrically insulating trench 172, but preferably not both, may be present in portion 200 of semiconductor component 100. Electrically insulating trenches 171 and 172 may have a width less than, greater than, or substantially equal to width 165.

In one embodiment, portion 200 of semiconductor component 100 optionally comprises a plurality of electrically insulating trenches including a set 240 comprising one or more of electrically insulating trench 160 and further including a set 250 comprising one or more of an electrically insulating trench 251. In one embodiment, set 240 further comprises an electrically insulating trench 164 in addition to electrically insulating trench 160. Set 240 circumscribes at least semiconductor device 130, and set 250 circumscribes at least semiconductor device 110. In the same or another embodiment, portion 200 of semiconductor component 100 further optionally comprises a set 190 comprising an electrically insulating trench 191. Set 190 circumscribes at least semiconductor device 110 and semiconductor device 130. In the same or another embodiment, portion 200 of semiconductor component 100 further optionally comprises an additional electrically insulating trench 180 located in semiconductor epitaxial layer 220 between semiconductor device 110 and ohmic contact region 150, and circumscribing semiconductor device 110. In the same or another embodiment, portion 200 of semiconductor component 100 further optionally comprises an additional electrically insulating trench 181 located in semiconductor epitaxial layer 220 between semiconductor device 130 and ohmic contact region 150, and circumscribing semiconductor device 130. More than one electrically insulating trench can be located: (1) between semiconductor device 110 and ohmic contact region 150 and circumscribing semiconductor device 110; (2) between semiconductor device 130 and ohmic contact region 150 and circumscribing semiconductor device 130; and (3) to circumscribe both semiconductor device 110 and semiconductor device 130.

Figure 3:
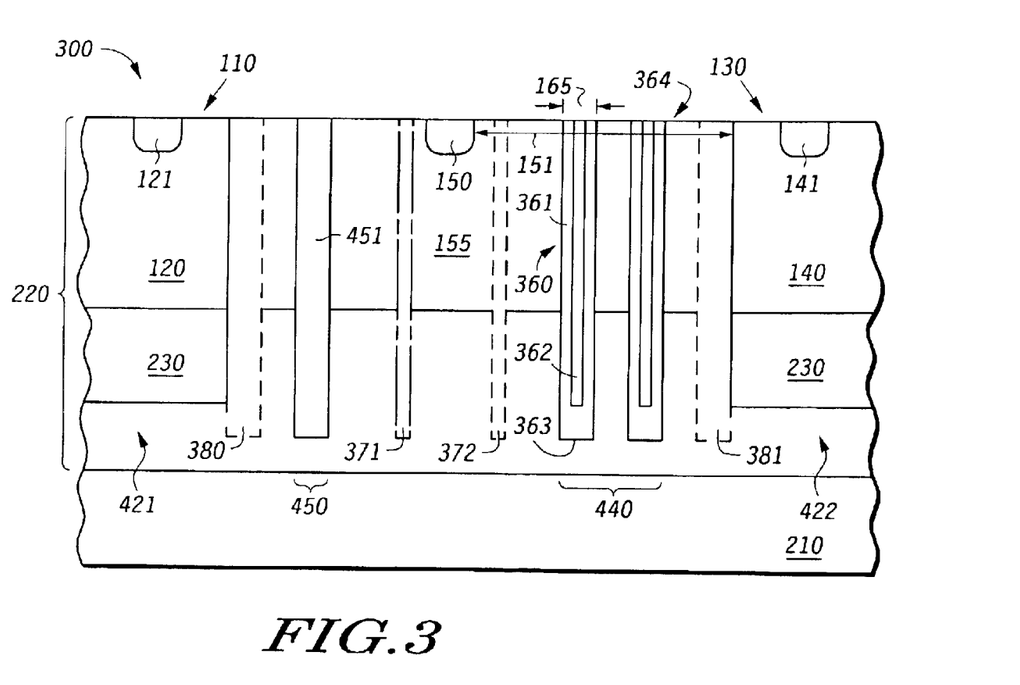
FIG. 3 is a cross sectional view of a portion of the semiconductor component of FIG. 1 taken along the section line 2—2 in FIG. 1 according to another embodiment of the invention.

FIG. 3 is a cross sectional view of a portion 300 of semiconductor component 100 of FIG. 1, also taken along the section line 2—2 in FIG. 1, according to a different embodiment of the invention. Portion 300 of semiconductor component 100 can be similar to portion 200 of semiconductor component 100 shown in FIG. 2, except as noted below. Referring to FIGS. 1 and 3, portion 300 of semiconductor component 100 comprises an electrically insulating trench 360, which in turn comprises a portion 361, a portion 362, and a lower surface 363. As an example, portions 361 and 362 can be similar to portions 261 and 262, respectively, of electrically insulating trench 160 in FIGS. 1 and 2, except that, unlike portion 262, portion 362, in the illustrated embodiment, does not extend to lower surface 363, nor does it contact semiconductor substrate 210. Furthermore, the doped polysilicon in portion 362 remains electrically floating during operation of portion 300 of semiconductor component 100, unlike the doped polysilicon in portion 262 of electrically insulating trench 160, which can be electrically biased during operation of portion 200 of semiconductor component 100. Lower surface 363 can be similar to lower surface 263 of electrically insulating trench 160 in FIGS. 1 and 2, except that lower surface 363 terminates in semiconductor epitaxial layer 220 and does not extend into semiconductor substrate 210. In a non-illustrated, alternate embodiment, portion 362 can extend to lower surface 363, can contact semiconductor epitaxial layer 220, and can be electrically biased.

Portion 300 of semiconductor component 100 can further comprise an electrically insulating trench 371 or an electrically insulating trench 372. As an example, electrically insulating trenches 371 and 372 can be similar to electrically insulating trenches 171 and 172, respectively, in FIGS. 1 and 2. Portion 300 of semiconductor component 100 can still further comprise a plurality of electrically insulating trenches including a set 440 comprising electrically insulating trench 360, and optionally comprising an electrically insulating trench 364, and a set 450 comprising an electrically insulating trench 451. As an example, sets 440 and 450 can be similar to sets 240 and 250, respectively, in FIG. 2, and electrically insulating trenches 360, 364, and 451 can be similar to electrically insulating trenches 160, 164, and 251, respectively, in FIGS. 1 and 2.

Portion 300 of semiconductor component 100 can still further comprise an additional electrically insulating trench 380 located in semiconductor epitaxial layer 220 between semiconductor device 310 and ohmic contact region 150, and circumscribing semiconductor device 310. In the same or another embodiment, portion 300 of semiconductor component 100 can still further optionally comprise an additional electrically insulating trench 381 located in semiconductor epitaxial layer 220 between semiconductor device 130 and ohmic contact region 150, and circumscribing semiconductor device 130.

In one embodiment, portion 300 of semiconductor component 100 can still further comprise a portion 421 of semiconductor epitaxial layer 220 located between semiconductor region 120 and semiconductor substrate 210. In the same or another embodiment, semiconductor region 140 is separated from semiconductor substrate 210 by a portion 422 of semiconductor epitaxial layer 220. In the same or another embodiment, a layer 230 is located between semiconductor region 120 and portion 421. Layer 230 or a different layer may also be located between semiconductor region 140 and portion 422.

Figure 4:
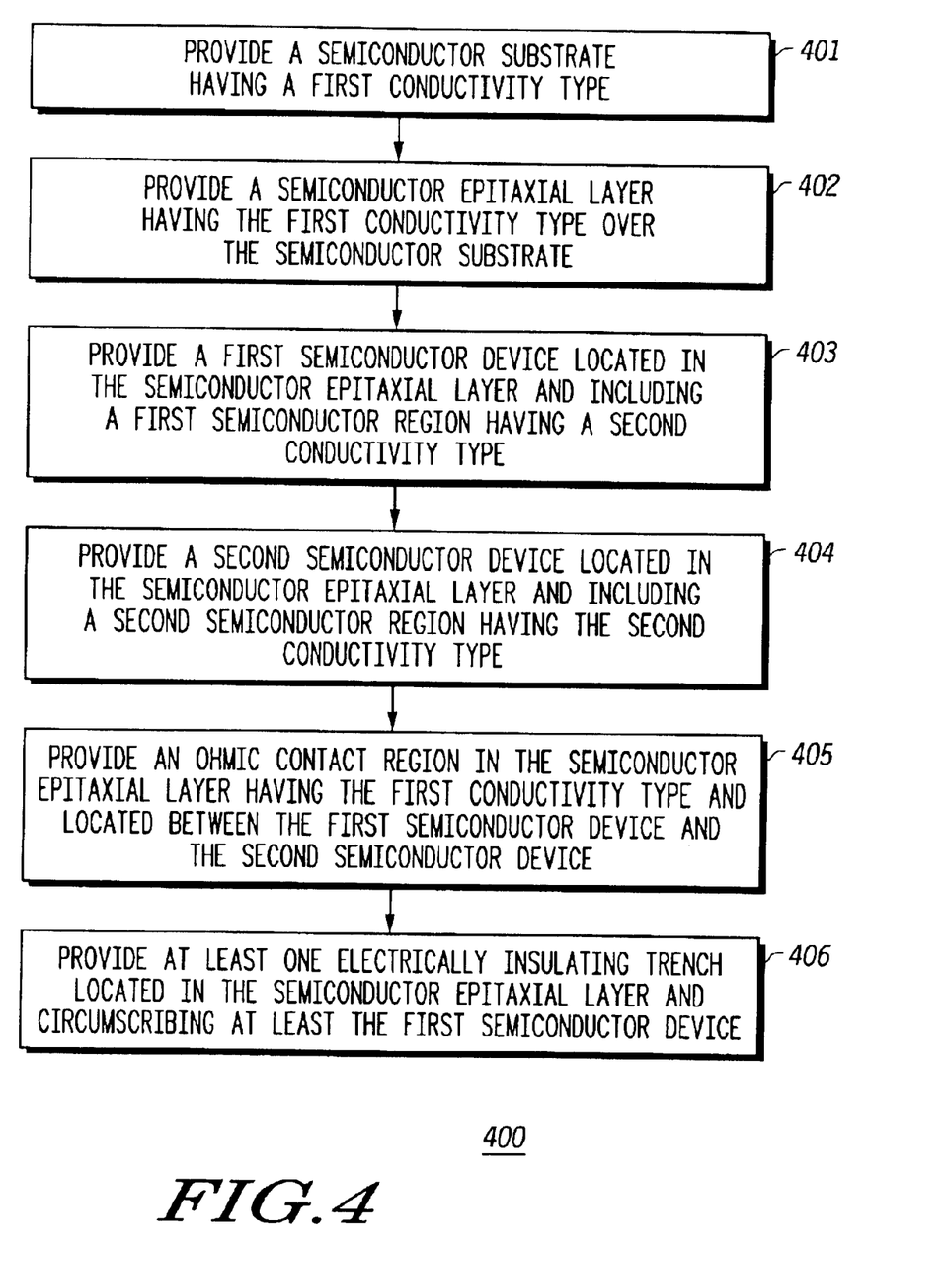
FIG. 4 is a flow chart illustrating a method of manufacturing a semiconductor component according to an embodiment of the invention.

FIG. 4 is a flow chart illustrating a method 400 of manufacturing a semiconductor component according to an embodiment of the invention. The term "manufacturing," as it is used herein, can include designing, fabricating, and assembling. Referring to FIG. 4, a step 401 of method 400 is to form, position, or otherwise provide a semiconductor substrate having a first conductivity type. As an example, the semiconductor substrate can be similar to semiconductor substrate 210 in FIGS. 2 and 3.

A step 402 of method 400 is to provide a semiconductor epitaxial layer having the first conductivity type over the semiconductor substrate. As an example, the semiconductor epitaxial layer can be similar to semiconductor epitaxial layer 220 in FIGS. 2 and 3.

A step 403 of method 400 is to provide a first semiconductor device located in the semiconductor epitaxial layer and including a first semiconductor region having a second conductivity type. As an example, the first semiconductor device can be similar to semiconductor device 110 in FIGS. 1, 2, and 3. As a further example, the first semiconductor region can be similar to semiconductor region 120 in FIGS. 1, 2, and 3.

A step 404 of method 400 is to provide a second semiconductor device located in the semiconductor epitaxial layer and including a second semiconductor region having the second conductivity type. As an example, the second semiconductor device can be similar to semiconductor device 130 in FIGS. 1, 2, and 3. As a further example, the second semiconductor region can be similar to semiconductor region 140 in FIGS. 1, 2, and 3. In one embodiment, step 404 can be performed before step 403. In another embodiment, step 403 and step 404 can be performed simultaneously.

A step 405 of method 400 is to provide an ohmic contact region in the semiconductor epitaxial layer having the first conductivity type and located between the first semiconductor device and the second semiconductor device. As an example, the ohmic contact region can be similar to ohmic contact region 150 in FIGS. 1, 2, and 3.

A step 406 of method 400 is to provide at least one electrically insulating trench located in the semiconductor epitaxial layer and circumscribing at least the first semiconductor device. As an example, the at least one electrically insulating trench can be similar to electrically insulating trench 160 in FIGS. 1 and 2. As another example, the at least one electrically insulating trench can be similar to electrically insulating trench 360 in FIG. 3.

In one embodiment, step 406 or a different step can comprise identifying a predetermined ratio of charge carriers collected by the second semiconductor region to charge carriers emitted by the first semiconductor region, determining a number of electrically insulating trenches that will limit an actual ratio of charge carriers collected by the second semiconductor region to charge carriers emitted by the first semiconductor region to be below the predetermined ratio of charge carriers collected by the second semiconductor region to charge carriers emitted by the first semiconductor region, and providing the number of electrically insulating trenches in the semiconductor epitaxial layer between the ohmic contact region and the second semiconductor device and circumscribing the first semiconductor device. In the same or another embodiment, step 406 can comprise positioning an additional trench separating the first semiconductor region from the ohmic contact region. As an example, the additional trench can be similar to additional electrically insulating trench 180 in FIGS. 1 and 2 and additional electrically insulating trench 380 in FIG. 3.

Step 405 can be performed before or after steps 403 and/or 404, and step 406 can be preformed before or after steps 403, 404, and/or 405. Step 405 can also be performed simultaneously with steps 403 and/or 404, and step 403 can also be performed simultaneously with step 404.

Although the invention has been described with reference to specific embodiments, it will be understood by those skilled in the art that various changes may be made without departing from the spirit or scope of the invention. Various examples of such changes have been given in the foregoing description. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the semiconductor component discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A semiconductor component comprising:
    a semiconductor substrate having a first conductivity type;
    a semiconductor epitaxial layer having the first conductivity type located over the semiconductor substrate;
    a first semiconductor device located in the semiconductor epitaxial layer and including a first semiconductor region having a second conductivity type;
    a second semiconductor device located in the semiconductor epitaxial layer and including a second semiconductor region having the second conductivity type;
    an ohmic contact region in the semiconductor epitaxial layer having the first conductivity type and located between the first semiconductor device and the second semiconductor device; and
    a plurality of electrically insulating trenches located in the semiconductor epitaxial layer, including a first set comprising at least one electrically insulating trench and a second set comprising a second electrically insulating trench,
    wherein:
        the semiconductor epitaxial layer has a doping concentration lower than a doping concentration of the semiconductor substrate;
        the first set circumscribes at least the first semiconductor device; and
        the second set circumscribes at least the second semiconductor device.

2. The semiconductor component of claim 1 wherein:
    the at least one electrically insulating trench comprises a greater number of electrically insulating trenches when the first semiconductor device is a higher current device than when the first semiconductor device is a lower current device.

3. The semiconductor component of claim 1 wherein:
    the first semiconductor region is separated from the semiconductor substrate by a first portion of the semiconductor epitaxial layer; and
    the second semiconductor region is separated from the semiconductor substrate by a second portion of the semiconductor epitaxial layer.

4. The semiconductor component of claim 1 wherein:
    the at least one electrically insulating trench extends into the semiconductor substrate.

5. The semiconductor component of claim 1 wherein:
the at least one electrically insulating trench further comprises:
a first portion comprising an oxide; and
a second portion interior to the first portion and comprising polysilicon; and
the polysilicon remains electrically floating during operation of the semiconductor component.

6. The semiconductor component of claim 1 wherein:
the at least one electrically insulating trench further comprises:
a lower surface in the semiconductor substrate;
a first portion comprising an oxide; and
a second portion comprising polysilicon, located interior to the first portion, extending to the lower surface, and contacting the semiconductor substrate; and
the polysilicon is electrically biased during operation of the semiconductor component.

7. The semiconductor component of claim 1 wherein:
the at least one electrically insulating trench consists of a single electrically insulating trench having a width substantially equal to a distance between the ohmic contact region and the second semiconductor device.

8. The semiconductor component of claim 1 wherein:
the ohmic contact region circumscribes at least the first semiconductor region.

9. The semiconductor component of claim 1 wherein:
the at least one electrically insulating trench further comprises a third set comprising a third trench; and
the third set circumscribes at least the first semiconductor device and the second semiconductor device.

10. The semiconductor component of claim 1 further comprising:
an additional trench located in the semiconductor epitaxial layer between the first semiconductor device and the ohmic contact region and circumscribing the first semiconductor device.

11. A semiconductor component comprising:
a P-type semiconductor substrate having a first doping concentration;
a P-type semiconductor epitaxial layer having a second doping concentration less than the first doping concentration by at least two orders of magnitude, and located over the P-type semiconductor substrate;
a first semiconductor device located in the P-type semiconductor epitaxial layer and including a first N-type semiconductor region;
a second semiconductor device located in the P-type semiconductor epitaxial layer and including a second N-type semiconductor region;
a P-type ohmic contact region in the P-type semiconductor epitaxial layer located between the first semiconductor device and the second semiconductor device; and
at least one electrically insulating trench located in the P-type semiconductor epitaxial layer and circumscribing at least the first semiconductor device,
wherein:
the first N-type semiconductor region emits a plurality of N-type carriers;
the at least one electrically insulating trench prevents at least a majority of the plurality of N-type carriers from entering the P-type semiconductor epitaxial layer under the second semiconductor device; and
the P-type ohmic contact region is electrically shorted to the P-type semiconductor substrate during operation of the semiconductor component.

12. The semiconductor component of claim 11 wherein:
the at least one electrically insulating trench comprises a greater number of electrically insulating trenches when the first semiconductor device is a higher current device than when the first semiconductor device is a lower current device.

13. The semiconductor component of claim 11 wherein:
the first N-type semiconductor region is separated from the P-type semiconductor substrate by a first portion of the P-type semiconductor epitaxial layer; and
the second N-type semiconductor region is separated from the P-type semiconductor substrate by a second portion of the P-type semiconductor epitaxial layer.

14. The semiconductor component of claim 11 wherein:
the at least one electrically insulating trench extends into the P-type semiconductor substrate.

15. The semiconductor component of claim 11 wherein:
the at least one electrically insulating trench further comprises:
a first portion comprising an oxide; and
a second portion interior to the first portion and comprising polysilicon; and
the polysilicon remains electrically floating during operation of the semiconductor component.

16. The semiconductor component of claim 11 wherein:
the at least one electrically insulating trench further comprises:
a lower surface in the P-type semiconductor substrate;
a first portion comprising an oxide; and
a second portion comprising polysilicon, located interior to the first portion, extending to the lower surface, and contacting the P-type semiconductor substrate; and
the polysilicon is electrically biased during operation of the semiconductor component.

17. The semiconductor component of claim 11 wherein:
the at least one electrically insulating trench consists of a single electrically insulating trench having a width substantially equal to a distance between the P-type ohmic contact region and the second semiconductor device.

18. The semiconductor component of claim 11 wherein:
the P-type ohmic contact region circumscribes at least the first N-type semiconductor region.

19. The semiconductor component of claim 12 wherein:
the at least one electrically insulating trench comprises a plurality of trenches including a first set comprising a first trench and a second set comprising a second trench;
the first set circumscribes at least the first semiconductor device; and
the second set circumscribes at least the second semiconductor device.

20. The semiconductor component of claim 19 wherein:
the at least one electrically insulating trench further comprises a third set comprising a third trench; and
the third set circumscribes at least the first semiconductor device and the second semiconductor device.

21. The semiconductor component of claim 11 further comprising:
an additional trench located in the P-type semiconductor epitaxial layer between the P-type ohmic contact region and the first semiconductor device and circumscribing the first semiconductor device.

22. A semiconductor component comprising:

a semiconductor substrate having a first conductivity type;

a semiconductor epitaxial layer having the first conductivity type located over the semiconductor substrate;

a first semiconductor device located in the semiconductor epitaxial layer and including a first semiconductor region having a second conductivity type;

a second semiconductor device located in the semiconductor epitaxial layer and including a second semiconductor region having the second conductivity type;

an ohmic contact region in the semiconductor epitaxial layer having the first conductivity type and located between the first semiconductor device and the second semiconductor device;

a first electrically insulating trench located in the semiconductor epitaxial layer and circumscribing at least the first semiconductor device; and a second electrically insulating trench located in the semiconductor epitaxial layer and circumscribing at least the first electrically insulating trench, the first semiconductor device, and the ohmic contact region.

* * * * *

UNITED STATES PATENT AND TRADEMARK OFFICE
CERTIFICATE OF CORRECTION

PATENT NO. : 6,815,780 B1  
APPLICATION NO. : 10/417972  
DATED : November 9, 2004  
INVENTOR(S) : Vishnu K. Khemka et al.

Page 1 of 1

It is certified that error appears in the above-identified patent and that said Letters Patent is hereby corrected as shown below:

In Column 10, Line 50, Claim No. 19:
Change "claim 12" to --claim 11--.

Signed and Sealed this
Seventeenth Day of May, 2011

David J. Kappos
*Director of the United States Patent and Trademark Office*